United States Patent
Hasebe

(10) Patent No.: US 7,600,422 B2
(45) Date of Patent: Oct. 13, 2009

(54) ELECTRONIC COMPONENTS PACKAGING STRUCTURE

(75) Inventor: Shinya Hasebe, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 11/878,685

(22) Filed: Jul. 26, 2007

(65) Prior Publication Data

US 2008/0047339 A1 Feb. 28, 2008

(30) Foreign Application Priority Data

Jul. 28, 2006 (JP) .............................. 2006-206497

(51) Int. Cl.
*G01F 1/68* (2006.01)
(52) U.S. Cl. .................................. 73/204.17
(58) Field of Classification Search ............... 29/837; 439/676, 174; 361/773; 174/262, 68.5; 731/204.17; 324/462; 73/204.17

See application file for complete search history.

(56) References Cited

U.S. PATENT DOCUMENTS 3,825,999 A * 7/1974 Rubey .................... 29/837
4,188,653 A * 2/1980 Goepel .................. 361/773
4,700,016 A * 10/1987 Hitchcock et al. ........... 174/262
6,428,361 B1 * 8/2002 Imschweiler et al. ........ 439/676
7,104,805 B2 * 9/2006 Hjort et al. .................. 439/74
2009/0096460 A1 * 4/2009 Watanabe et al. ........... 324/462

FOREIGN PATENT DOCUMENTS

JP 09-133563 A 5/1997

* cited by examiner

*Primary Examiner*—Jewel Thompson
(74) *Attorney, Agent, or Firm*—Cheng Law Group, PLLC

(57) ABSTRACT

In a preferred embodiment, a thermal mass flow meter is provided with: a pipe arrangement that allows a fluid to flow therein, a chip-type heat-generating element that is anchored on the surface on the periphery of the pipe arrangement and used for heating the fluid in the pipe arrangement, and paired chip-type temperature sensors that are anchored at positions on the upstream side and the downstream side of the heat-generating element with the same distance apart therefrom, on the surface of the pipe arrangement, and formed as members separated from the heat-generating element. With respect to the heat-generating element and the paired temperature sensors, convex portions thereof on a side opposite to the side to be anchored onto the pipe arrangement are housed in a concave of a printed-circuit board, and terminals of the heat-generating element and the paired temperature sensors are connected to the wiring layer of the printed-circuit board, and subsequently secured to the printed-circuit board.

7 Claims, 5 Drawing Sheets

ELECTRONIC COMPONENTS PACKAGING STRUCTURE

BACKGROUND OF THE INVENTION

1. Field of the Invention

This invention relates to a packaging structure in which electronic components are mounted on a substrate. With respect to such a packaging structure, for example, thermal mass flow meters, thermal current meters, Pirani gauges, light-emitting element packaging structures and packaging structures of an electronic component such as a large-capacity capacitor are listed.

2. Description of the Related Art

Upon packaging an electronic component such as a sensor on a substrate such as a printed-circuit board, normally, the electronic component is mounted on the surface of the substrate. For this reason, the substrate of the packaging structure comes to have a surface with irregularities.

For example, as a thermal flow sensor used for measuring a flow speed or a flow rate of a fluid, such a flow sensor has been known in which a heat-generating resistor forming a flow-speed detecting resistance and a temperature measuring resistor forming a temperature compensating resistance are formed on a surface of an insulating layer integrally formed on the surface of a silicon substrate. In the thermal flow sensor of this kind, the silicon substrate under the heat-generating resistor is removed by a means, such as anisotropic etching, so that a space portion is formed therein; thus, the rear face of the insulating layer is exposed so that the heat-generating resistor and the silicon substrate are thermally insulated from each other (see Japanese Unexamined Patent Publication No. 9-133563).

In the thermal flow sensor, although the space portion is formed on the rear face side of the substrate, both the heat-generating resistor and the temperature-measuring resistor are formed on the surface of the substrate, and are not formed in the space portion.

Here, since electronic components such as sensors mounted on the substrate surface can be easily touched, those components that are vulnerable to damage when touched tend to have a higher possibility of malfunction.

The substrate surface is not flat when electronic components have been mounted thereon; therefore, in the case when a component that is adversely affected in its performances upon receipt of a stress is mounted, it is highly possible that the performances of the resulting packaging structure become unstable.

Moreover, upon packaging a substrate on which electronic components have been mounted on a pipe-shaped member having a limitation in its space, those components having a large volume are not adopted in some cases. As a result, instead of using an inexpensive component having a large volume, a component that has a smaller volume, but is expensive, needs to be mounted to sometimes cause high costs.

SUMMARY OF THE INVENTION

The objective of the present invention is to solve a problem caused by an electronic component sticking out from a substrate on which it is mounted.

The electronic component packaging structure in accordance with the present invention comprises a printed-circuit board having a wiring layer formed on a surface or inside of a substrate and a hole through or a concave on the substrate, and an electronic component of which at least one portion is housed in the hole or the concave of the printed-circuit board. The electronic component is connected to the wiring layer so as to be joined electrically and mechanically to the printed-circuit board. Here, the hole or the concave is formed through or on the printed-circuit board by a machining process or the like.

In the present invention, by housing at least one portion of the electronic component in the hole or the concave of the printed-circuit board, the surface of the printed-circuit board can be formed into a flat shape or a shape close to the flat shape. As a result, since the surface of the printed-circuit board is formed into the flat shape or the shape close to the flat shape, it becomes possible to package the component without applying a stress thereon, and consequently to provide stable performances. Even in the case of an electronic component that is vulnerable to malfunction when touched, since the possibility of touch is made smaller, the possibility of malfunction is also made smaller. Moreover, since one portion of the volume of the electronic component is received by the hole or the concave of the printed-circuit board, even a large-size component can be attached thereto. Since any of the above-mentioned structures can be achieved by using existing manufacturing line of electronic circuits and machining process, it is not necessary to prepare a new facility, thereby making it possible to reduce the costs.

One example of the electronic component packaging structure of the present invention is a thermal mass flow meter. The thermal mass flow meter is provided with: a pipe arrangement that allows a fluid to flow therein, a chip-type heat-generating element that is anchored on the surface on the periphery of the pipe arrangement and used for heating the fluid in the pipe arrangement, and paired chip-type temperature sensors that are anchored at positions on the upstream side and the downstream side of the heat-generating element the same distance apart therefrom along the flowing direction of the fluid in the pipe arrangement on the surface of the pipe arrangement, and formed as members separated from the heat-generating element. In this thermal mass flow meter, the heat-generating element and the paired temperature sensors correspond to the electronic components, with convex portions thereof on a side opposite to the side to be anchored onto the pipe arrangement being housed in the hole or the concave of the printed-circuit board, and terminals of the electronic components are connected to the wiring layer of the printed-circuit board so as to be joined to the printed-circuit board.

In order to provide a superior thermal conductivity between the heat-generating element as well as the temperature sensor and the pipe arrangement, it is preferable that the anchoring of the heat-generating element and the temperature sensors to the pipe arrangement is conducted through a bonding process by a thermally conductive adhesive.

When force is exerted on the anchored portion between the heat-generating element as well as the temperature sensor and the pipe arrangement, the thermal conductive performance between the heat-generating element as well as the temperature sensor and the pipe arrangement is varied, with the result that the flow rate detecting performance tends to vary by the lapse of time. For this reason, the pipe arrangement is preferably joined to be secured also to the surface of the printed-circuit board. One of the examples of the pipe arrangement is a pipe arrangement that allows a mobile phase to flow therethrough in a high performance liquid chromatograph.

Another example of the electronic component packaging structure of the present invention is a thermal current meter. The thermal current meter is provided with a metal thin wire serving as the electronic component, and a constant current is allowed to flow through the metal thin wire to be heated so that, with the heat balance being set to an equilibrium state, the current speed is found based upon the resulting change in the resistance value of the metal thin wire. The metal thin wire is housed in the hole of the printed-circuit board, with the two ends being connected to the wiring layer of the printed-circuit board so as to be joined electrically and mechanically to the printed-circuit board. The fluid to be measured is allowed to flow through the hole of the printed-circuit board in which the metal thin wire is housed so that the current speed is found based upon the change in the resistance value of the metal thin wire.

Still another example of the electronic component packaging structure of the present invention is a Pirani gauge. The Pirani gauge is provided with: a metal thin wire serving as the electronic component, and a constant current is allowed to flow through the metal thin wire to be heated so that, with the heat balance being set to an equilibrium state, the degree of vacuum is found based upon the resulting change in the resistance value of the metal thin wire. The metal thin wire is housed in the hole of the printed-circuit board, with the two ends being connected to the wiring layer of the printed-circuit board so as to be joined electrically and mechanically to the printed-circuit board.

Another example of the electronic component packaging structure of the present invention is a light-emitting element packaging structure. The light-emitting element packaging structure is provided with a light-emitting element serving as the electronic component, and the light-emitting element is housed in the hole or the concave of the printed-circuit board, with terminals thereof being connected to the wiring layer of the printed-circuit board so as to be joined electrically and mechanically to the printed-circuit board.

DETAILED DESCRIPTION OF THE INVENTION

Embodiment 1

Figure 1A:
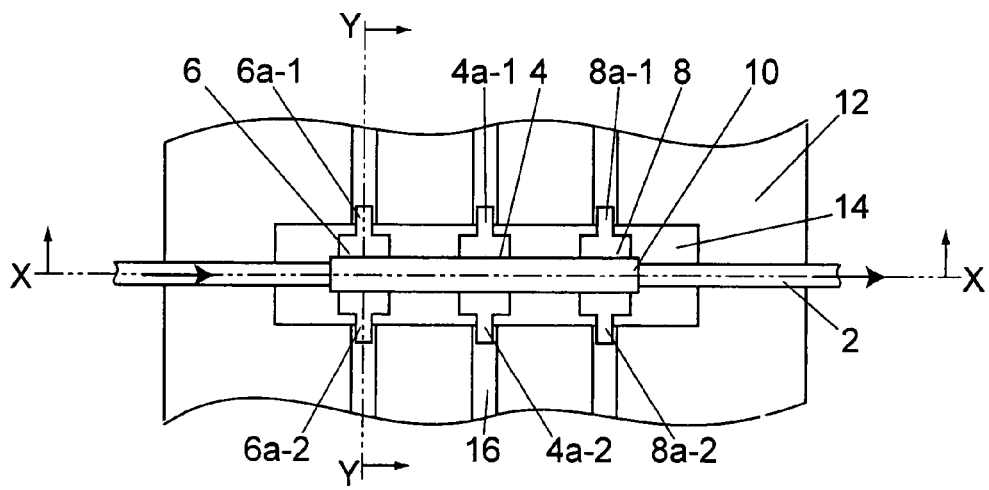
FIG. 1A is a plan view that shows an embodiment in which the present invention is applied to a thermal mass flow meter.
Figure 1B:
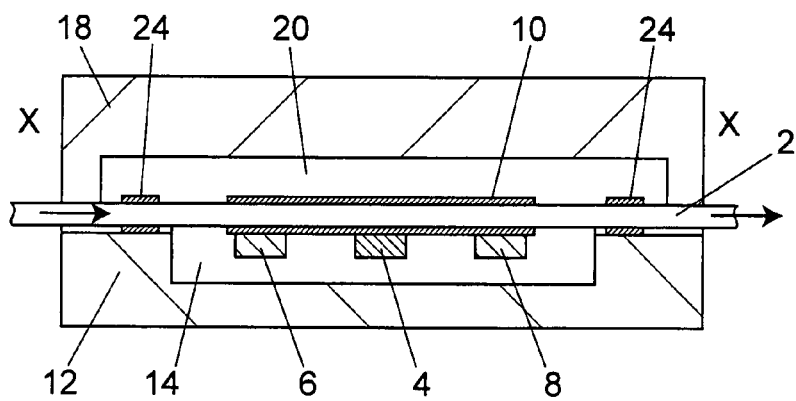
FIG. 1B is a cross-sectional view taken along line X-X of FIG. 1A.
Figure 1C:
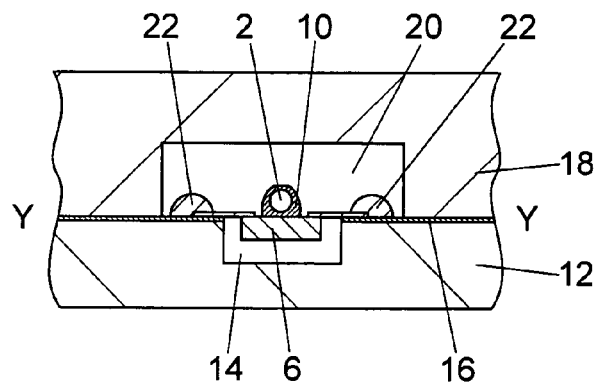
FIG. 1C is a cross-sectional view taken along line Y-Y of FIG. 1A.

The following description will discuss a thermal mass flow meter utilizing chip diodes as a first embodiment FIG. 1A is a plan view that shows one embodiment of a thermal mass flow meter, FIG. 1B is a cross-sectional view at X-X position of FIG. 1A, and FIG. 1C is a cross-sectional view at Y-Y position of FIG. 1A. In this embodiment, a cover 18 used for covering a measuring unit of the thermal mass flow meter from above is provided; however, this is not shown in FIG. 1A.

A pipe arrangement 2 is placed on a horizontal face, and one of the faces of the pipe arrangement 2 is referred to as upper side, and the other face thereof is referred to as lower side. Moreover, in this embodiment, the pipe arrangement 2 is placed on the horizontal face, and this embodiment also includes structures in which the pipe arrangement 2 is placed in a vertical direction or in a tilted state, and in these cases also, one of the faces thereof is referred to as upper side, and the other face thereof is referred to as lower side.

The pipe arrangement 2 is a pipe arrangement used for a high performance liquid chromatograph. A mobile phase is allowed to flow from the left side to the right side through the pipe arrangement 2, as shown by arrows in FIGS. 1A and 1B. On the peripheral face of the pipe arrangement 2, a heater chip 4 serving as a heat-generating element is placed on the lower side of the pipe arrangement 2.

A temperature sensor chip 6 is placed on the upstream side of the heater chip 4 on the lower side of the pipe arrangement 2, and a temperature sensor chip 8 is placed on the downstream side of the heater chip 4 on the lower side of the pipe arrangement 2. The temperature sensor chips 6 and 8 are placed at positions of the equal distance apart from the heater chip 4.

The heater chip 4 and the temperature sensor chips 6 and 8 are anchored on the pipe arrangement 2 by a thermally conductive adhesive 10 (for example, thermally conductive silicone sealant KE3467: product of Shin-Etsu Chemical Co., Ltd.).

With respect to the heater chip 4, a chip diode (for example, ISS387: product of Toshiba Corporation), a chip resistance (for example, RK73H1JT: product of KOA Corporation) or the like may be used. The temperature sensor chips 6 and 8 may be thermocouples or diodes formed into chips.

As shown in this embodiment, a gap between the heater chip 4 and the temperature sensor chips 6 and 8 may also be filled with the thermally conductive adhesive 10. With this arrangement, the thermal conductivity between the heater chip 4 and the pipe arrangement 2 as well as the thermal conductivity between the thermal sensor chips 6 and 8 and the pipe arrangement 2 can be improved.

Those faces of the heater chip 4 and the temperature sensor chips 6 and 8, anchored onto the pipe arrangement 2, form element faces, and are provided with two lead terminals 4a-1, 4a-2, 6a-1, 6a-2, 8a-1 and 8a-2 that extend sideward from the respective element faces.

With respect to each of the heater chip 4 and the temperature sensor chips 6 and 8, a convex portion on the side opposite to the element face is housed in a concave 14 of a printed-circuit board 12 serving as a lower-side heat-insulating member, and a space on the element face side is covered with a cover 18 serving as an upper-side heat-insulating member. Thus, the heater chip 4 and the temperature sensor chips 6 and 8 are isolated from the outside. A wiring pattern 16, made of a metal film, is formed on the surface of the printed-circuit board 12. The base substrate of the printed-circuit board 12 is, for example, a glass epoxy substrate or a polyimide substrate. The concave 14 having a rectangular shape is formed in the printed-circuit board 12, with the wiring pattern 16 being drawn and directed outward from the concave 14. The lead terminals 4a-1, 4a-2, 6a-1, 6a-2, 8a-1 and 8a-2 of the heater chip 4 and the temperature sensor chips 6 and 8 are electrically connected to the wiring pattern 16, and drawn to the outside.

The cover 18 is placed in a manner so as to cover the measuring portion of the printed-circuit board 12 from above. There are gaps among the cover 18, the heater chip 4 and the temperature sensor chips 6 and 8, with air layers 20 being interposed therein. The cover 18 is composed of a heat-insulating material, or is coated with a heat-insulating adhesive (for example, Toraypef (registered trademark): product of Toray Industries, Inc.), or a resin such as silicone, on the outside thereof. With this arrangement, air located on the measuring portion is isolated from the outside air.

Referring to FIG. 1(C), the following description will discuss the positional relationship between the measuring portion including the pipe arrangement 2 and the printed-circuit board 12 as well as the cover 18. Here, the explanation is given to a portion on which the temperature sensor chip 6 is placed, and the other portions on which the heater chip 4 and the temperature sensor chip 8 are placed have the same structure.

With respect to the temperature sensor chip 6, a convex portion thereof is fitted to the concave 14 of the printed-circuit board 12, with the element face of the main body portion facing up. The dimensions of the concave 14 is set to such a size that clearances are present between the convex portion of the temperature sensor chip 6 and the wall faces of the inside of the concave 14, with the temperature sensor chip 6 being supported on the printed-circuit board 12 only by the lead terminals 6a-1 and 6a-2. The lead terminals 6a-1 and 6a-2 are anchored on the wiring pattern 16 by solder 22 so as to be connected to the printed-circuit board 12 electrically as well as mechanically.

The pipe arrangement 2 is anchored onto the element face of the main-body portion of the temperature sensor chip 6 by a thermally conductive adhesive 10. The pipe arrangement 2 is also anchored onto a plurality of portions of the printed-circuit board 12 by an insulating adhesive 24.

Since the measuring portion including the portions on which the heater chip 4 and the temperature sensor chips 6 and 8 are placed is isolated from the outside by the printed-circuit board 12 and the cover 18, the resulting structure is less vulnerable to influences of a temperature change of the outside air so that it becomes possible to measure a flow rate with high precision. Moreover, since the heater chip 4 and the temperature sensor chips 6 and 8 are supported on the printed-circuit board 12 only by the respective lead terminals so that clearances are formed between those chips and the wall faces inside the concave 14, with air layers being interposed therein, it is possible to further enhance the heat-insulating effect by utilizing a high heat-insulating property of the air layers. With this arrangement, the wall thickness below the concave 14 can be made thinner, making it possible to reduce the costs. In the same manner, clearances are prepared among the heater chip 4, the temperature sensor chips 6 and 8 and the cover 18 with air layers being interposed therein; therefore, it becomes possible to enhance the heat-insulating effect by utilizing a high heat-insulating property of the air layers.

Figure 2A:
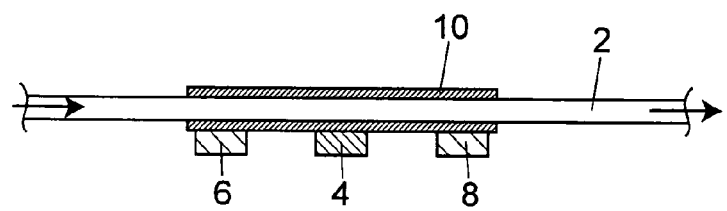
FIG. 2A is a cross-sectional view of an element portion, which explains the operations of the embodiment.
Figure 2B:
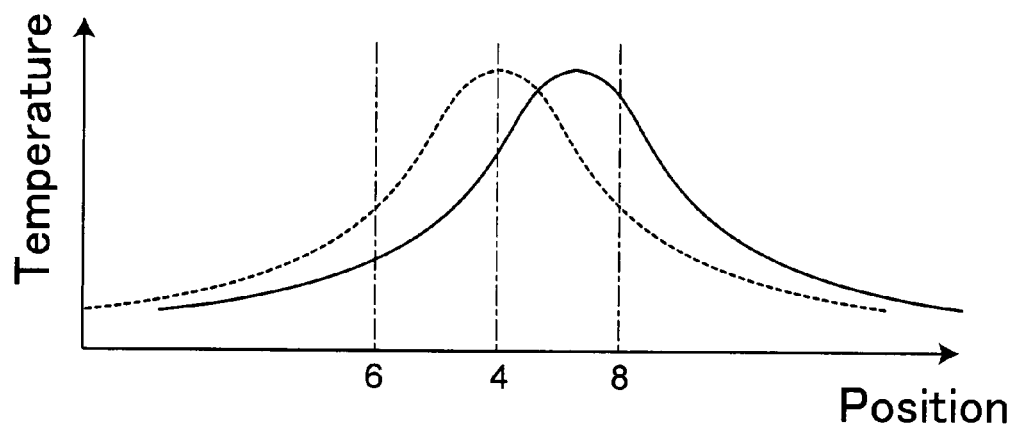
FIG. 2B is a graph that shows a temperature distribution, which explains the operations of the embodiment.

Referring to FIGS. 2A and 2B, the following description will discuss the operational principle of the thermal mass flow meter of the present embodiment FIG. 2A is a drawing that shows portions of the heater chip 4 and the temperature sensor chips 6 and 8, and FIG. 2B is a drawing that shows the position of the pipe arrangement 2 and the temperature distribution thereof.

In FIG. 2B, in a state where no mobile phase is flowing through the pipe arrangement 2, the temperature distribution of a fluid heated by a heater is distributed virtually in accordance with the Gaussian distribution so that as indicated by a curve shown by a broken line, the temperature distribution is formed in a right and left symmetrical manner centered on a position of the heater chip 4 serving as an apex of the temperature distribution. Therefore, in this state, the temperature at the position of the temperature sensor chip 6 and the temperature at the position of the temperature sensor chip 8 are equal to each other so that the difference between these is 0.

In contrast, when the mobile phase is allowed to flow through the pipe arrangement 2, the curve indicating the temperature distribution is shifted toward the downstream side (to the right in the Figure), as indicated by a solid line, with the result that a difference is caused between the temperature at the position of the temperature sensor chip 6 and the temperature at the position of the temperature sensor chip 8.

Since the apex of the temperature distribution is shifted toward the downstream side by an increase in the flow rate of the mobile phase flowing through the pipe arrangement 2, the difference between the detected temperature of the temperature sensor chip 6 and the detected temperature of the temperature sensor chip 8 increases as the flow rate of the mobile phase increases so that the flow rate of the mobile phase and the temperature difference are allowed to have a correlation. By preliminarily measuring this correlation to prepare calibration curve data, the flow rate of the mobile phase flowing through the pipe arrangement 2 can be calculated based upon the calibration curve data by measuring the difference between the temperature detected by the temperature sensor chip 6 and the temperature detected by the temperature sensor chip 8.

Conventionally, with respect to the thermal mass flow meter that measures a fine flow rate, those flow meters in which a heater and sensors are assembled into a one-chip by using a fine machining technique have been used. Providing the fine machining technique tends to cause high costs in the manufacturing facilities and the like and the subsequent high costs of the products. In contrast, in the thermal mass flow meter of the present embodiment, since a heater chip and temperature sensor chips, individually manufactured, are used, it can be carried out at low costs.

On the other hand, in a method in which a pipe arrangement is attached to a heater chip and sensor chips afterward without using the fine machining technique, the pipe arrangement is mounted by using a thermally conductive adhesive, and in this case, the face on which the pipe arrangement through which the fluid flows is mounted needs to be a flat face without irregularities so as not to impose any stress on the pipe arrangement In the case when the packaging process is carried out, with a stress being imposed on the pipe arrangement, the distances between the mounted pipe arrangement and the chips are changed due to aged deterioration of the adhesive, resulting in a change in the way of how to transmit heat Once this state occurs, the performances of the flow meter vary depending on time, failing to accurately measure the flow rate. However, in the present embodiment, since a manufacturing line and a machining process line for a printed-circuit board can be used to provide a hole or a concave to house the chips, it becomes possible to obtain a flat face free from irregularities as the pipe arrangement packaging face.

In the present embodiment, the concave 14 is formed in the printed-circuit board 12, and the heater chip 4 and the temperature sensor chips 6 and 8 are housed therein; therefore, it is possible to utilize the heat-insulating effect by air layers inside the concave 14. In the present invention, however, the portion to be used for housing the electronic components is not necessarily limited to the concave, and a through hole may be used. In this case, although the heat-insulating effect of air is not utilized, the electronic components can be housed in the hole so as to be protected.

Embodiment 2

Figure 3A:
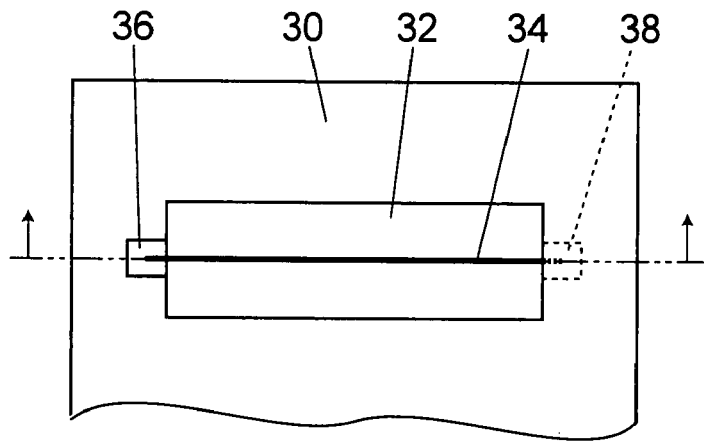
FIG. 3A is a plan view that shows an embodiment in which the present invention is applied to a thermal current meter.
Figure 3B:
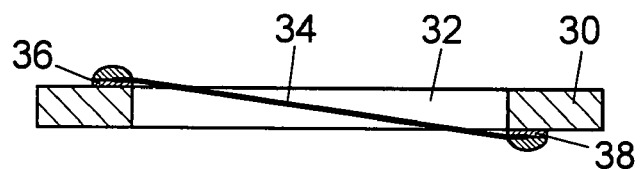
FIG. 3B is a cross-sectional view taken along a metal thin wire of FIG. 3A.
Figure 3C:
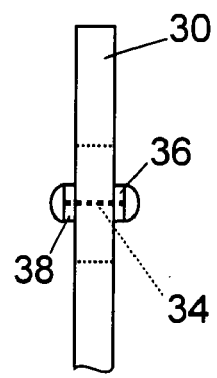
FIG. 3C is a side view of FIG. 3A.

Referring to FIGS. 3A to 3C, the following description will discuss an example in which the electronic component packaging structure of the present invention is applied to a thermal current meter as a second embodiment FIG. 3A is a plan view, FIG. 3B is a cross-sectional view taken along a metal thin wire, and FIG. 3C is a side view.

A hole 32 is formed in a printed-circuit board 30, and a metal thin line 34 is housed in the hole 32. One end of the metal thin wire 34 is solder-connected to a contact pad 36 that is connected to a wiring layer on the surface side of the printed-circuit board 30, with the other end being solder-connected to a contact pad 38 that is connected to a wiring layer on the rear face side of the printed-circuit board 30. With this arrangement, the metal thin wire 34 is electrically connected to the printed-circuit board 30, and is also mechanically secured thereto.

The thermal current meter has a structure in which a constant electric current is allowed to flow through the metal thin wire 34 to be heated, and the heat from the metal thin wire 34 is released into the air through heat radiation so that, when the heat balance is set to an equilibrium state, the heat is converged into a given temperature. When a wind collides with the metal thin wire 34 in the equilibrium state, the amount of the temperature drop is measured so that the gas volume is measured. When, upon collision of the wind with the metal thin wire 34, the temperature of the heated metal thin wire 34 drops, it causes a change in the resistance value. With respect to the metal thin wire 34, platinum is a substance that exerts a linear relationship between the temperature and the resistance, and is often used for the current meter. In the case when platinum line is used for the metal thin wire 34, the resistance value of the platinum line and the wind velocity have a correlation so that by measuring the resistance value of the platinum line, the wind velocity is obtained.

In the thermal current meter, the metal thin wire 34 is used, and it is highly possible that when, upon production or the like, it is erroneously touched, it will malfunction easily.

Therefore, as shown in the embodiment of FIGS. 3A to 3C, the metal thin wire 34 is housed in a space portion prepared as the hole 32 formed in the printed-circuit board 30 so as to be protected; thus, it becomes possible to reduce the possibility of malfunction, and consequently to cut the costs.

Moreover, conventionally, the metal thin wire 34 is secured onto a different part; however, by packaging the metal thin wire 34 in the space 32 formed in the printed-circuit board 30, the number of the components can be reduced, making it possible to cut the costs.

Embodiment 3

The following description will discuss an example in which the electronic component packaging structure of the present invention is applied to a Pirani gauge. The Pirani gauge has basically the same operational principle as the thermal current meter. It has a structure in which a constant current is allowed to flow through a metal thin wire to be heated so that the fact that the electrical resistance of the metal thin wire is changed by the temperature is utilized. The thermal conductivity varies depending on the degree of vacuum to cause a change in the temperature of the metal thin wire. The change in resistance of the metal thin wire is read so that the correlation between it and the degree of vacuum is acquired.

In the Pirani gauge to which the present invention is applied also, the same effects as explained in the thermal current meter of embodiment 2 can be obtained.

Embodiment 4

Figure 4A:
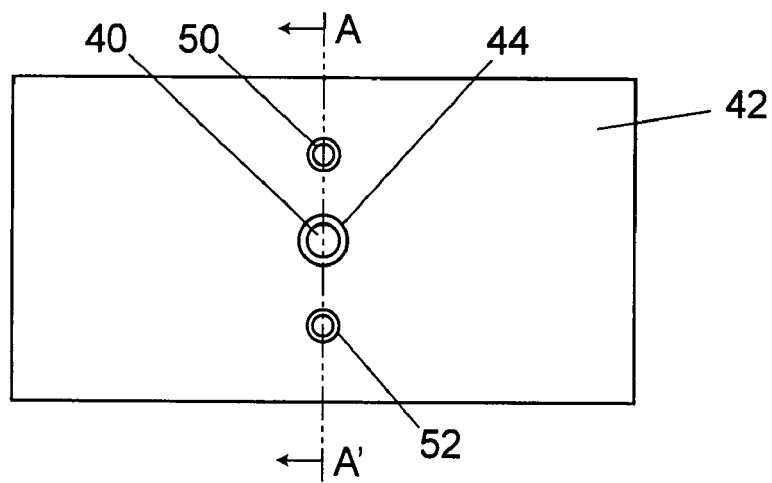
FIG. 4A is a plan view that shows an embodiment in which the present invention is applied to a light-emitting element packaging structure.
Figure 4B:
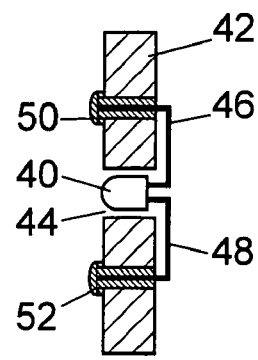
FIG. 4B is a cross-sectional view taken along line A-A of FIG. 4A.

Referring to FIGS. 4A and 4B, the following description will discuss an example in which the electronic component packaging structure of the present invention is applied to a light-emitting element packaging structure as a fourth embodiment FIG. 4A is a plan view and FIG. 4B is a cross-sectional view taken along line A-A of FIG. 4A. An LED 40 (light-emitting diode), which is a light-emitting element serving as an electronic component, is housed in a hole 44 of a printed-circuit board 42, and its terminals 46 and 48 are solder-connected to lands 50 and 52 connected to a wiring layer, via a through hole of the printed-circuit board 42. With this arrangement, the LED 40 is electrically connected to the printed-circuit board 42, and is also mechanically secured thereto.

In place of the hole 44 used for housing the LED 40, a concave with a bottom may be used. In this embodiment also, since the LED 40, which is an electronic component, is housed in the hole or the concave of the printed-circuit board 42, it is prevented from damages due to contact upon manufacturing or transporting.

Embodiment 5

Figure 5A:
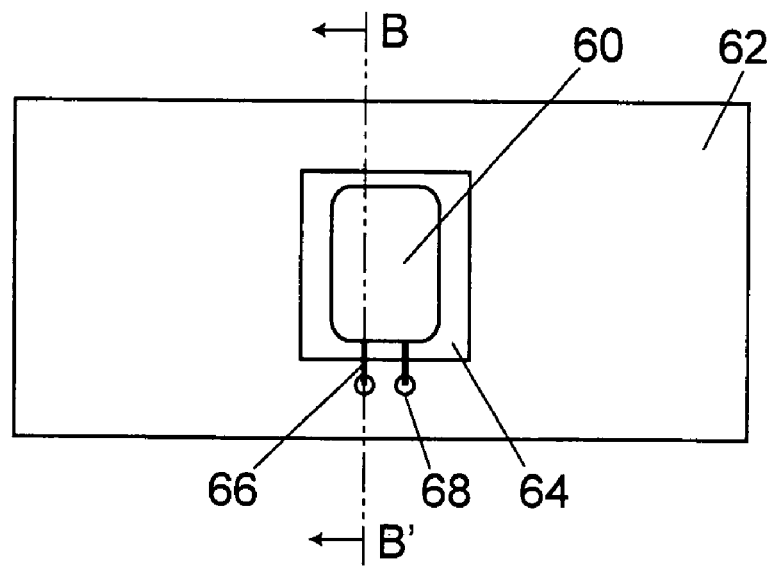
FIG. 5A is a plan view that shows an embodiment in which the present invention is applied to a large-size electronic component packaging structure.
Figure 5B:
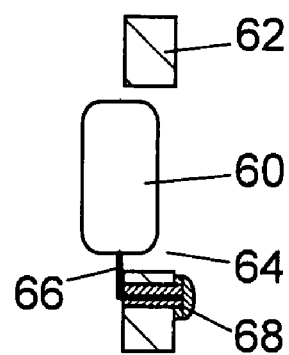
FIG. 5B is a cross-sectional view taken along line B-B of FIG. 5A.

Referring to FIGS. 5A and 5B, the following description will discuss an example in which the electronic component packaging structure of the present invention is applied to a large-size electronic component packaging structure such as a large-capacity capacitor, as a fifth embodiment FIG. 5A is a plan view and FIG. 5B is a cross-sectional view taken along line B-B of FIG. 5A.

A large-capacity capacitor 60, which is an electronic component, is housed in a hole 64 of a printed-circuit board 62, and its terminal 66 is solder-connected to a land 68 connected to a wiring layer, via a through hole of the printed-circuit board 62. With this arrangement, the large-capacity capacitor 60 is electrically connected to the printed-circuit board 62, and is also mechanically secured thereto.

In place of the hole 64 used for housing the large-capacity capacitor 60, a concave with a bottom may be used. In this embodiment also, since the large-capacity capacitor 60, which is an electronic component, is housed in the hole or the concave of the printed-circuit board 62, it is possible to save space.

What is claimed is:

1. An electronic component packaging structure comprising:
   a printed-circuit board having a wiring layer formed on a surface or inside of a substrate, the printed-circuit board having a hole or a concave on the substrate; and
   an electronic component connected to the wiring layer so as to be joined electrically and mechanically to the printed-circuit board, with at least a main body portion of the electronic component being housed in the hole or the concave;
   wherein the electronic component packaging structure is a thermal mass flow meter comprising
   a pipe arrangement that allows a fluid to flow therein, a chip-type heat-generating element anchored on the surface on the periphery of the pipe arrangement and used for heating the fluid in the pipe arrangement, and a pair of chip-type temperature sensors anchored at positions on the upstream side and the downstream side of the heat-generating element the same distance apart therefrom along the flowing direction of the fluid in the pipe arrangement, on the surface of the pipe arrangement, the chip-type temperature sensors being formed as members separated from the heat-generating element, wherein the heat-generating element and the chip-type temperature sensors correspond to the electronic components, with convex portions thereof on a side opposite to the side to be anchored onto the pipe arrangement being housed in the hole or the concave of the printed-circuit board, and terminals of the electronic components are connected to the wiring layer of the printed-circuit board so as to be joined to the printed-circuit board.

2. The electronic component packaging structure according to claim 1, wherein the anchoring of the heat-generating element and the temperature sensors to the pipe arrangement is a bonding by a thermally conductive adhesive.

3. The electronic component packaging structure according to claim 2, wherein the pipe arrangement is joined to be secured to the surface of the printed-circuit board.

4. The electronic component packaging structure according to claim 1, wherein the pipe arrangement is a pipe arrangement through which a mobile phase is allowed to flow in a high performance liquid chromatograph.

5. An electronic component packaging structure comprising:

a printed-circuit board having a wiring layer formed on a surface or inside of a substrate, the printed-circuit board having a hole or a concave on the substrate; and an electronic component connected to the wiring layer so as to be joined electrically and mechanically to the printed-circuit board, with at least a main body portion of the electronic component being housed in the hole or the concave;

wherein the electronic component packaging structure is a thermal current meter comprising a metal thin wire serving as the electronic component, wherein a constant current is allowed to flow through the metal thin wire to be heated so that, with the heat balance being set to an equilibrium state, the current speed is found based upon the resulting change in the resistance value of the metal thin wire, and the metal thin wire is housed in the hole of the printed-circuit board, with the two ends being connected to the wiring layer so as to be joined electrically and mechanically to the printed-circuit board.

6. An electronic component packaging structure comprising:

a printed-circuit board having a wiring layer formed on a surface or inside of a substrate, the printed-circuit board having a hole or a concave on the substrate; and an electronic component connected to the wiring layer so as to be joined electrically and mechanically to the printed-circuit board, with at least a main body portion of the electronic component being housed in the hole or the concave;

wherein the electronic component packaging structure is a Pirani gauge comprising a metal thin wire serving as the electronic component, wherein a constant current is allowed to flow through the metal thin wire to be heated so that with the heat balance being set to an equilibrium state, the degree of vacuum is found based upon the resulting change in the resistance value of the metal thin wire, and the metal thin wire is housed in the hole of the printed-circuit board, with the two ends being connected to the wiring layer so as to be joined electrically and mechanically to the printed-circuit board.

7. An electronic component packaging structure comprising:

a printed-circuit board having a wiring layer formed on a surface or inside of a substrate, the printed-circuit board having a hole or a concave on the substrate; and an electronic component connected to the wiring layer so as to be joined electrically and mechanically to the printed-circuit board, with at least a main body portion of the electronic component being housed in the hole or the concave;

wherein the electronic component packaging structure is a light-emitting element packaging structure comprising a light-emitting element serving as the electronic component, wherein the light-emitting element is housed in the hole or the concave of the printed-circuit board, with terminals thereof being connected to the wiring layer so as to be joined electrically and mechanically to the printed-circuit board.

* * * * *